(12) United States Patent
Yu

(10) Patent No.: US 9,368,866 B2
(45) Date of Patent: Jun. 14, 2016

(54) SHIELDING MODULE INTEGRATING ANTENNA AND INTEGRATED CIRCUIT COMPONENT

(71) Applicant: SJ ANTENNA DESIGN, Taipei (TW)

(72) Inventor: Ya Chung Yu, Taipei (TW)

(73) Assignee: SJ ANTENNA DESIGN, Taipei (TW)

( * ) Notice: Subject to any disclaimer, the term of this patent is extended or adjusted under 35 U.S.C. 154(b) by 534 days.

(21) Appl. No.: 13/942,684

(22) Filed: Jul. 15, 2013

(65) Prior Publication Data

US 2014/0225795 A1 Aug. 14, 2014

(30) Foreign Application Priority Data

Feb. 8, 2013 (TW) .............................. 102105471 A

(51) Int. Cl.
| | |
|---|---|
| *H01Q 1/52* | (2006.01) |
| *H01Q 1/22* | (2006.01) |
| *H01Q 9/04* | (2006.01) |
| *H01Q 13/08* | (2006.01) |
| *H01Q 19/30* | (2006.01) |
| *H01L 23/13* | (2006.01) |
| *H01L 23/498* | (2006.01) |
| *H01L 23/00* | (2006.01) |

(52) U.S. Cl.
CPC ................ *H01Q 1/526* (2013.01); *H01L 23/13* (2013.01); *H01L 23/49822* (2013.01); *H01Q 1/2283* (2013.01); *H01Q 9/0407* (2013.01); *H01Q 13/085* (2013.01); *H01Q 19/30* (2013.01); *H01L 23/49827* (2013.01); *H01L 24/13* (2013.01); *H01L 24/16* (2013.01); *H01L 2224/13101* (2013.01); *H01L 2224/16225* (2013.01); *H01L 2924/15321* (2013.01)

(58) Field of Classification Search
CPC ... H01Q 1/526; H01Q 1/2283; H01Q 9/0407; H01L 23/49822; H01L 23/49827; H01L 2924/1531; H01L 2224/16225
See application file for complete search history.

(56) References Cited

U.S. PATENT DOCUMENTS 7,616,167 B2 * 11/2009 Anzai ............... H01L 21/76898
257/621
7,649,499 B2 * 1/2010 Watanabe ............ H01L 25/162
343/700 MS (Continued)

OTHER PUBLICATIONS

Kuo, H.-C.; Wang, H.-H.; Yue, H.-L.; Ou, Y.-W.; Lin, C.-C.; Chuang, H.-R.; Huang, T.-H., "A 60-GHz fully integrated CMOS sub-harmonic RF receiver with mm-wave on-chip AMC-antenna/balun-filter and on-wafer wireless transmission test," in Microwave Symposium Digest (MTT), 2012 IEEE MTT-S International , vol., No., pp. 1-3, Jun. 17-22, 2012.*

(Continued)

*Primary Examiner* — Sue A Purvis
*Assistant Examiner* — Amal Patel
(74) *Attorney, Agent, or Firm* — Cheng-Ju Chiang

(57) ABSTRACT

The present invention provides a shielding module integrating antenna and integrated circuit component, which comprises an artificial magnetic conductor board, an antenna, a common ground face, a plurality of first via holes, a shielding slot, a plurality of second via holes, and an IC component. The IC component is embedded in the shielding slot formed between the common ground face and surrounded by the plurality of second via holes of the artificial magnetic conductor board. Accordingly, the antenna is formed and shielded above the shielding slot, the plurality of second via holes, and the IC component separated by the common ground face and the plurality of first via holes of the artificial magnetic conductor board. As a result, the package area of integrated circuit component and cost is reduced while shielded from external noise and electromagnetic interference.

18 Claims, 2 Drawing Sheets

(56) References Cited

U.S. PATENT DOCUMENTS 7,852,281 B2 * 12/2010 Choudhury .......... H01Q 1/2291
343/700 MS
9,112,263 B2 * 8/2015 Pagani ............. G06K 19/07749

OTHER PUBLICATIONS

Hiramatsu, N.; Melde, K.L., "Folded monopole antenna over an artificial magnetic conductor for chip-to-chip communications," in Antennas and Propagation (APSURSI), 2011 IEEE International Symposium on , vol., No., pp. 1193-1196, Jul. 3-8, 2011.*

* cited by examiner

SHIELDING MODULE INTEGRATING ANTENNA AND INTEGRATED CIRCUIT COMPONENT

CROSS REFERENCE TO RELATED APPLICATIONS

This application claims priority under 35 U.S.C 119 to Taiwan (R.O.C.) patent application, 102105471, filed on Feb. 8, 2013, the disclosure of which is incorporated herein by reference.

BACKGROUND OF THE INVENTION

1. Field of the Invention

The present invention relates to an antenna shielding module, and more particularly, to a shielding module integrating an antenna and integrated circuit (IC) component.

2. Description of the Prior Art

While wireless communication systems become more and more popular, wireless communication function is required at more and more applications in order to satisfy consumers' needs. Antenna is an important component used for transmitting and receiving electromagnetic wave in wireless communication system. If antenna is absent, wireless communication system is not capable of transmitting and receiving data. Therefore, antenna is a key component to system performance. Currently, popular wireless communication standards include IEEE 802.11, Bluetooth (IEEE 802.15.1), and etc. The specification IEEE 802.11 is further classified into 802.11a, 802.11b, and 802.11g. The working frequency defined by the 802.11a specification is at 5 GHz band. And the rest 802.11b and 802.11g specifications work at 2.4 GHz as well as Bluetooth wireless communication specification. Besides, full high definition (HD) 1080P audio/video high speed transmission applications such as Wigig (Wireless Gigabit) and Wireless HD work at 60 GHz band and are capable to reach data rate at 20 Gbit/sec. Apparently, high definition audio/video high speed transmission module is a must for future mobile communication device. The IEEE 802.11 ad standard includes a specification defining such kind of high speed transmission which is parallel to existing 802.11b/g/n specifications.

Since electromagnetic wave traveling at 60 GHz would be absorbed by oxygen molecules in the atmosphere, the signal strength is attenuated quickly. The transmission range is quite limited (less than 10 meters). This limitation seriously affects data rate and applicable scenarios. Therefore the characteristics of high frequency RFIC (radio frequency integrated circuit) as well as the radiation pattern and efficiency of antenna are quite important. Generally, IC components such as LNA (low noise amplifier), PA (power amplifier), and mixer are packaged in metal shielding box to prevent external electromagnetic noise and interference.

In most cases, antenna is arranged surrounding RFIC. Surrounding clear spaces of the antenna are required in order to maintain electromagnetic characteristics of antenna. However, the volume inside future mobile communication device is quite limited. The clear spaces surrounding antenna and traditional metal shielding box of IC will occupy a lot of precious space of circuit board of mobile communication device. The complexity, cost, and volume of product would be increased accordingly. In addition, there are many discrete passive components contained in the modern mobile communication device. More wireless communication specifications are supported, more antennas are required. In consequence, the area or volume required to be shielded is increased. The miniaturization trend of reducing circuit board volume and compacting end-product size would affect the whole performance of the mobile communication device and increase the difficulty of integrating an antenna device and circuit board. Hence, there exists a need of a shielding module integrating an antenna and IC component.

In summarized, Applicant provides the present invention "shielding module integrating an antenna and integrated circuit component" to improve the shortcomings of the prior art.

From the above it is clear that prior art still has shortcomings. In order to solve these problems, efforts have long been made in vain, while ordinary products and methods offering no appropriate structures and methods. Thus, there is a need in the industry for a novel technique that solves these problems.

SUMMARY OF THE INVENTION

The present invention is related to a shielding module integrating an antenna and integrated circuit component. The radiation pattern of the antenna is end-fired pattern or broadside pattern. And the integrated circuit component is a radio frequency integrated circuit or a discrete passive component. The IC component is embedded in a shielding slot formed around a common ground face and multiple via holes of an artificial magnetic conductor board. Because the antenna is located above the IC component, the total area occupied by IC component and cost is reduced accordingly. In addition, the shielding module integrating an antenna and IC component maintains performance of the antenna and provides electromagnetic interference shielding mechanism between the antenna and the IC component. Signal transmission of the antenna is shielded from the IC component.

One of objectives of the present invention is to provide a shielding module integrating an antenna and integrated circuit component, comprises an artificial magnetic conductor board, an antenna, a common ground face, a plurality of first via holes, a shielding slot, a plurality of second via holes, and an IC component. The artificial magnetic conductor board comprises a first surface and a second surface opposite to the first surface. The antenna is arranged to locate on the first surface of the artificial magnetic conductor board. The common ground face is arranged to be interposed between the first surface and the second surface of the artificial magnetic conductor board. The plurality of first via holes is formed between the first surface of the artificial magnetic conductor board and the common ground face. The shielding slot arranged as an indentation off the second surface of the artificial magnetic conductor board and touches the common ground face. The plurality of second via holes is formed between the second surface of the artificial magnetic conductor board and the common ground face and surrounding the shielding slot. The integrated circuit component embedded in the shielding slot off the second surface and is flip-chip packaged to be electrically coupled to the common ground face. The antenna is formed and shielded above the shielding slot, the plurality of second via holes, and the IC component separated by the common ground face and the plurality of first via holes of the artificial magnetic conductor board.

The above description is only an outline of the technical schemes of the present invention. Preferred embodiments of the present invention are provided below in conjunction with the attached drawings to enable one with ordinary skill in the art to better understand said and other objectives, features and advantages of the present invention and to make the present invention accordingly.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Figure 1:
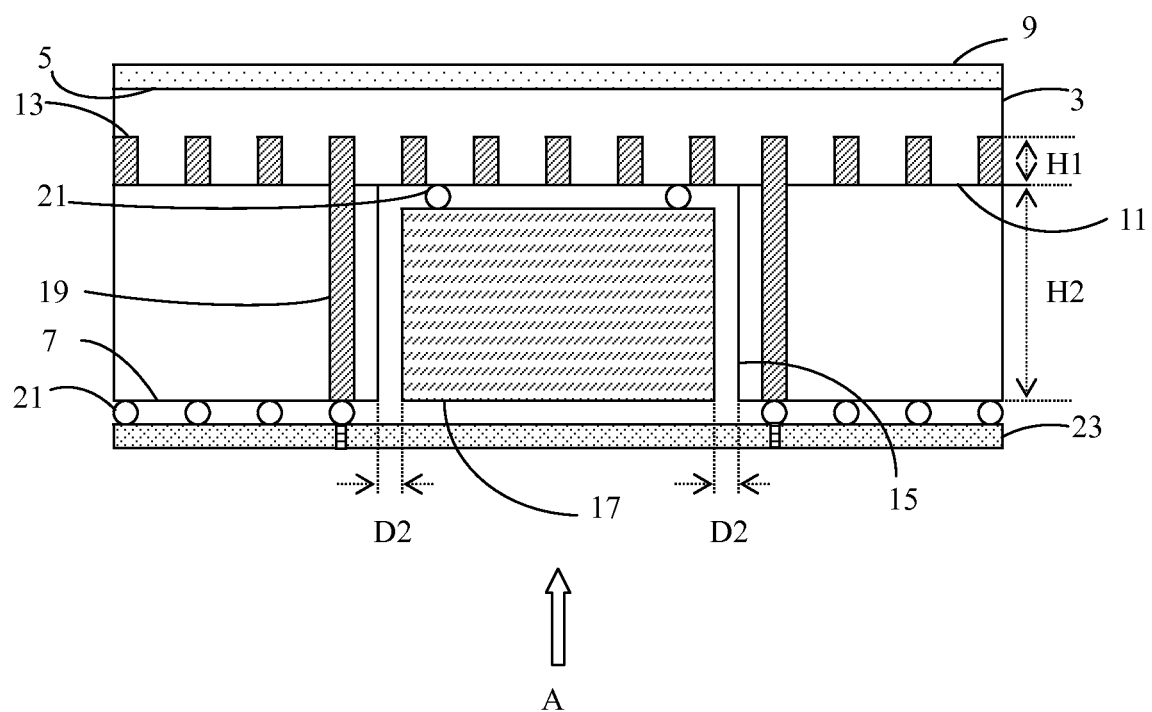
FIG. 1 is a cross section diagram showing a shielding module integrating an antenna and integrated circuit component in accordance with a preferred embodiment of the present invention.

Some embodiments of the present invention are described in details below. However, in addition to the descriptions given below, the present invention can be applicable to other embodiments, and the scope of the present invention is not limited by such, rather by the scope of the claims. Moreover, for better understanding and clarity of the description, some components in the drawings may not necessary be drawn to scale, in which some may be exaggerated relative to others, and irrelevant parts are omitted.

Please refer to FIG. 1, which is a cross section diagram showing a shielding module integrating an antenna and IC component in accordance with a preferred embodiment of the present invention. As shown in the FIG. 1, the shielding module 1 integrating an antenna and IC component of the present invention comprises an artificial magnetic conductor board 3, an antenna 9, a common ground face 11, a plurality of first via holes 13, a shielding slot 15, a plurality of second via holes 19, and an IC component 17. The artificial magnetic conductor board 3 comprises a first surface 5 and a second surface 7 opposite to the first surface 5. The artificial magnetic conductor board may be a LTCC (low temperature co-fired ceramics) board or a multi-layered PCB (printed circuit board). The antenna 9 capable of working at V band is located on the first surface 5 of the artificial magnetic conductor board 3. The antenna 9 may be a tapered slot antenna or a Yagi antenna which works at a center frequency equals or exceeds 60 GHz. The radiation pattern is end-fired radiation pattern parallel to the artificial magnetic conductor board 3. The common ground face 11 is interposed between the first surface 5 and the second surface 7 of the artificial magnetic conductor board 3. Alternatively, the antenna 9 may be a combination of the common ground face 11 and a patch antenna which works at a center frequency equals or exceeds 60 GHz. And the radiation pattern is broad-side radiation pattern perpendicular to the artificial magnetic conductor board 3.

As shown in the FIG. 1, the plurality of first via holes 13 is formed between the first surface 5 of the artificial magnetic conductor board 3 and the common ground face 11. The height H1 is less than odd multiples of a quarter of wavelength. The shielding slot 15 is an indentation off the second surface 7 of the artificial magnetic conductor board 3. One end of the shielding slot 15 touches the common ground face 11. The plurality of second via holes 19 is formed between the common ground face 11 and the second surface 7 surrounding the shielding slot 15. The height H2 is less than odd multiples of a quarter of wavelength. IC component is embedded in the shielding slot 15 off the second surface 7. The IC component is flip-chip packaged to be electrically coupled to the common ground face 11 via multiple soldering elements 21. The IC component 17 may be a RFIC or a discrete passive component. Accordingly, the antenna 9 is formed above the shielding slot 15, the plurality of second via holes 19, and IC component 17 separated by the common ground face 11 and the plurality of first via holes 13 of the artificial magnetic conductor board 3. The shielding module 1 integrating an antenna and IC component of the present invention may be electrically coupled to a PCB 23 via multiple soldering elements 21.

Figure 2:
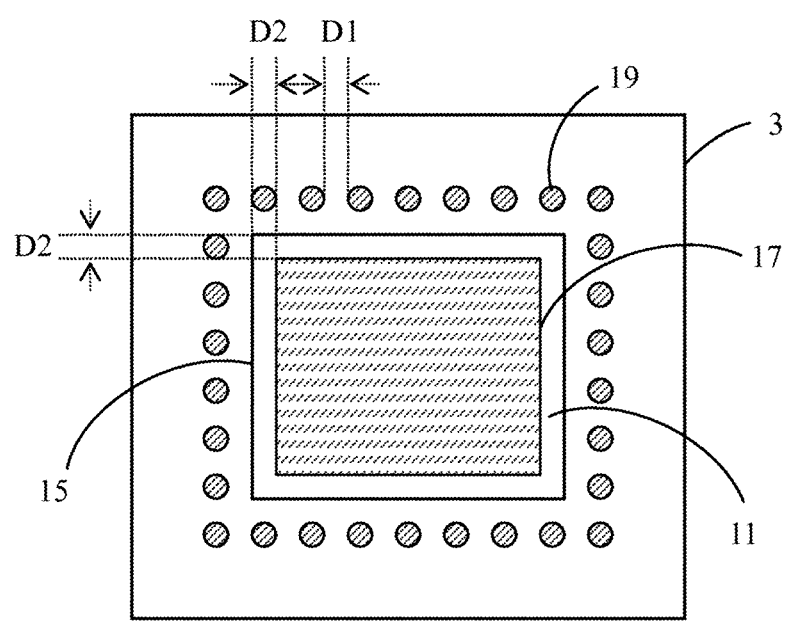
FIG. 2 is a plain view from viewing angle A shown in the FIG. 1.

Please refer to FIG. 1 and FIG. 2 together. FIG. 2 is a plain view of the second surface 7 of the artificial magnetic conductor board 3 from viewing angle A shown in the FIG. 1. The same components shown in the FIG. 1 and FIG. 2 with the same numerals have the same functionalities. No further discussion is described here. As shown in the FIG. 2, IC component 17 is embedded in the shielding slot 15 between the common ground face 11 and surrounded by the plurality of second via holes 19. The distance D1 between the second via holes is less than odd multiple of a quarter of wavelength. The distance D2 between IC component 17 and walls of the shielding slot 15 is less than odd multiple of a quarter of wavelength.

In summarized, the shielding module integrating an antenna and IC component according to the present invention comprises an artificial magnetic conductor board, an antenna, a common ground face, a plurality of first via holes, a shielding slot, a plurality of second via holes and an IC component. The IC component is embedded in the shielding slot formed between the common ground face and surrounded by the plurality of second via holes of the artificial magnetic conductor board. Accordingly, the antenna is formed and shielded above the shielding slot, the plurality of second via holes, and the IC component separated by the common ground face and the plurality of first via holes of the artificial magnetic conductor board. As a result, the package area and cost of IC component is reduced while external noise and electromagnetic interference is shielded. The original characteristics and performance of antenna and high frequency RFIC are remained the same.

The above embodiments are only used to illustrate the principles of the present invention, and they should not be construed as to limit the present invention in any way. The above embodiments can be modified by those with ordinary skill in the art without departing from the scope of the present invention as defined in the following appended claims.

What is claimed is:

1. A shielding module integrating an antenna and integrated circuit (IC) component, comprising:
    an artificial magnetic conductor board, comprising a first surface and a second surface opposite to the first surface;
    an antenna arranged to locate on the first surface of the artificial magnetic conductor board;
    a common ground face arranged to be interposed between the first surface and the second surface of the artificial magnetic conductor board;
    a plurality of first via holes formed between the first surface of the artificial magnetic conductor board and the common ground face;
    a shielding slot arranged as an indentation off the second surface of the artificial magnetic conductor board and touches the common ground face;
    a plurality of second via holes formed between the second surface of the artificial magnetic conductor board and the common ground face and surrounding the shielding slot; and an integrated circuit component embedded in the shielding slot off the second surface, wherein the IC component is flip-chip packaged to be electrically coupled to the common ground face;

wherein the antenna is formed and shielded above the shielding slot, the plurality of second via holes, and the IC component separated by the common ground face and the plurality of first via holes of the artificial magnetic conductor board.

2. The shielding module of claim 1, wherein the artificial magnetic conductor board is a LTCC (low temperature co-fired ceramics) board or a multilayered PCB (printed circuit board).

3. The shielding module of claim 1, wherein the antenna works at V band.

4. The shielding module of claim 1, wherein the antenna is tapered slot antenna or Yagi antenna.

5. The shielding module of claim 4, wherein the antenna works at a center frequency equals or exceeds 60 GHz.

6. The shielding module of claim 4, wherein the radiation pattern of the antenna is end-fired radiation pattern.

7. The shielding module of claim 4, wherein the radiation pattern of the antenna is parallel to the artificial magnetic conductor board.

8. The shielding module of claim 1, wherein the antenna is a combination of the common ground face and a patch antenna.

9. The shielding module of claim 8, wherein the antenna works at a center frequency equals or exceeds 60 GHz.

10. The shielding module of claim 8, wherein the radiation pattern of the antenna is broadside radiation pattern.

11. The shielding module of claim 8, wherein the radiation pattern is perpendicular to the artificial magnetic conductor board.

12. The shielding module of claim 1, wherein the height of the plurality of first via holes is less than odd multiples of a quarter of wavelength.

13. The shielding module of claim 1, wherein the height of the plurality of second via holes is less than odd multiples of a quarter of wavelength.

14. The shielding module of claim 1, wherein the distance between of the second via holes is less than odd multiples of a quarter of wavelength.

15. The shielding module of claim 1, wherein the IC component is a radio frequency IC or a discrete passive component.

16. The shielding module of claim 1, wherein the distance between the IC component and walls of shielding slot is less than odd multiples of a quarter of wavelength.

17. A shielding module integrating an antenna and integrated circuit (IC) component, comprising:
an artificial magnetic conductor board, comprising a first surface and a second surface opposite to the first surface, wherein an antenna is arranged to locate on the first surface of the artificial magnetic conductor board;
a common ground face arranged to be interposed between the first surface and the second surface of the artificial magnetic conductor board;
a plurality of first via holes formed between the first surface of the artificial magnetic conductor board and the common ground face;
a shielding slot arranged as an indentation off the second surface of the artificial magnetic conductor board and touches the common ground face, wherein an integrated circuit component embedded in the shielding slot off the second surface; and
a plurality of second via holes formed between the second surface of the artificial magnetic conductor board and the common ground face and surrounding the shielding slot;
wherein the antenna is formed and shielded above the shielding slot, the plurality of second via holes, and the IC component separated by the common ground face and the plurality of first via holes of the artificial magnetic conductor board.

18. The shielding module of claim 17, wherein the IC component is flip-chip packaged to be electrically coupled to the common ground face.

* * * * *